(12) United States Patent
Sugizaki (10) Patent No.: US 6,437,434 B1
(45) Date of Patent: Aug. 20, 2002

(54) SEMICONDUCTOR DEVICE AND SEMICONDUCTOR DEVICE MOUNTING INTERCONNECTION BOARD

(75) Inventor: Yoshiaki Sugizaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/963,639

(22) Filed: Sep. 27, 2001

(30) Foreign Application Priority Data

Sep. 29, 2000 (JP) .................................... 2000-301306

(51) Int. Cl.$^7$ ............................................. H01L 23/48
(52) U.S. Cl. .................... 257/692; 257/738; 257/778; 257/779; 257/780; 257/784; 257/786; 228/180.22
(58) Field of Search ................................ 257/690, 692, 257/693, 734, 735, 737, 738, 777, 778, 779, 783, 784, 786, 787, 780; 228/180.22

(56) References Cited

U.S. PATENT DOCUMENTS 5,977,641 A * 11/1999 Takahashi et al. .......... 257/778
6,236,701 B1 * 12/2001 Shinogi et al. ............. 257/797
6,344,696 B2 * 2/2002 Nakamura et al. .......... 257/786

FOREIGN PATENT DOCUMENTS

| JP | 11-111896 | 4/1999 |
| JP | 2000-164761 | 6/2000 |

* cited by examiner

*Primary Examiner*—David L. Talbott
*Assistant Examiner*—Alonzo Chamblis
(74) *Attorney, Agent, or Firm*—Finnegan, Henderson, Farabow, Garrett & Dunner, L.L.P.

(57) ABSTRACT

A semiconductor device includes a substrate, an external connection terminal, a penetrating outer moat in a doughnut form, a first interconnection, a second interconnection and a conductor. The outer moat is formed in a portion of the substrate which surrounds the external connection terminal. The first interconnection is provided on one-surface side of the substrate which is surrounded by the outer moat and electrically connected to the external connection terminal. The second interconnection is provided on one-surface side of the semiconductor chip which lies outside the outer moat and electrically connected to an internal circuit. The conductor has a bent portion and electrically connects the first and second interconnections to each other.

22 Claims, 4 Drawing Sheets

SEMICONDUCTOR DEVICE AND SEMICONDUCTOR DEVICE MOUNTING INTERCONNECTION BOARD

CROSS-REFERENCE TO RELATED APPLICATIONS

This application is based upon and claims the benefit of priority from the prior Japanese Patent Application No. 2000-301306, filed Sep. 29, 2000, the entire contents of which are incorporated herein by reference.

BACKGROUND OF THE INVENTION

1. Field of the Invention

This invention relates to a semiconductor device and a semiconductor device mounting interconnection board and more particularly to an Si (silicon) semiconductor chip and an interconnection board formed of Si.

2. Description of the Related Art

When a semiconductor device is mounted on a resin-series mounting board, it is necessary to make a design so as to prevent breakage of the electrical connection between a semiconductor chip and the mounting board by stress due to a temperature change, since Si, forming the semiconductor chip, has a small thermal expansion coefficient (5 ppm) and the resin used for forming the mounting board has a large thermal expansion coefficient (17 ppm in the case of BT resin, for example). The above problem becomes more significant as the designed density of elements becomes higher and the elements are further miniaturized, and particularly, the problem becomes serious in CSP (Chip Scale Package or Chip Size Package) using the flip chip technique.

For example, in the technique disclosed in U.S. Pat. No. 5,148,266 and Jpn. Pat. Appln. KOKAI Publication No. 11-284099, connection with the semiconductor chip is made by use of a flexible beam lead or gold wire and elastomer is used to make it difficult to transmit stress from the semiconductor chip to a solder ball, which is a connection terminal for connection with the mounting board.

Figure 1:
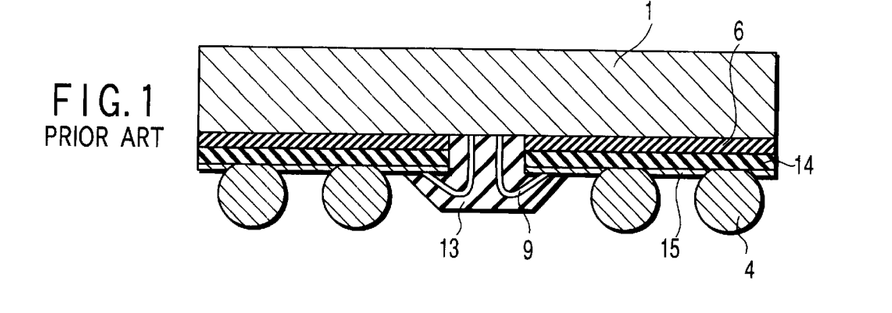
FIG. 1 is a cross sectional view for illustrating the conventional semiconductor device.

FIG. 1 is a cross sectional view showing the package structure disclosed in Jpn. Pat. Appln. KOKAI Publication No. 11-284099. A semiconductor chip 1 is adhered to an organic insulating tape 14 via an elastomer layer 6 and interconnections of the semiconductor chip 1 and interconnections 15 on the organic insulating tape 14 are respectively connected via bonding wires 9. The bonding wires 9 are covered with a resin layer 13. Further, BGA balls 4 are formed on the interconnections 15 on the organic insulating tape 14.

With the above structure, since the BGA balls 4 which are formed on the undersurface of the organic insulating tape 14 and used as external connection terminals are separated from the semiconductor chip 1 by the elastomer layer 6, the stress due to a difference in the thermal expansion between the semiconductor chip 1 and the mounting board can be alleviated.

However, with the above structure, since a large difference in thermal expansion exists between the semiconductor chip 1 and the organic insulating tape 14, the package will be warped even though the elastomer layer 6 is disposed therebetween. Since the uniform height of each of the external connection terminals (BGA balls 4) is more strictly required and the connection strength thereof becomes lower as the pitch therebetween becomes smaller, it is necessary to further reduce the stress applied to the external connection terminals. Therefore, with the package of the above structure, at present, it is difficult to cope with a connection pitch smaller than 0.5 mm, for example.

The above problem occurs in exactly the same manner in the technique disclosed in other known publications similar to the technique disclosed in U.S. Pat. No. 5,148,266 and a technique for providing a connection structure effective for a connection pitch smaller than 0.5 mm has not yet been developed.

BRIEF SUMMARY OF THE INVENTION

According to an aspect of the present invention, there is provided a semiconductor device comprising a semiconductor chip; an external connection terminal formed on a circuit forming surface side of the semiconductor chip; an outer moat formed in a portion of the semiconductor chip which surrounds the external connection terminal and penetrating therethrough in a doughnut form; a first interconnection formed on a portion of the semiconductor chip which lie on the circuit forming surface side and is surrounded by the outer moat and electrically connected to the external connection terminal; a second interconnection formed on the circuit forming surface side of the semiconductor chip outside the outer moat and electrically connected to an internal circuit; and a conductor which electrically connects the first and second interconnections to each other, the conductor having at least one bent portion.

According to another aspect of the present invention, there is provided a semiconductor device comprising a semiconductor chip; an external connection terminal formed on a rear surface side of the semiconductor chip which is opposite to a circuit forming surface side thereof; an outer moat formed in a portion of the semiconductor chip which surrounds the external connection terminal and penetrating therethrough in a doughnut form; a first interconnection formed on a portion of the semiconductor chip which lie on the circuit forming surface side and is surrounded by the outer moat and electrically connected to the external connection terminal via a penetration hole formed in the semiconductor chip; a second interconnection formed on the circuit forming surface side of the semiconductor chip outside the outer moat and electrically connected to an internal circuit; and a conductor which electrically connects the first and second interconnections to each other, the conductor having at least one bent portion.

According to still another aspect of the present invention, there is provided a semiconductor device comprising an interconnection board; a semiconductor body adhered to the interconnection board by use of an elastomer; an internal connection terminal formed in an adhering potion between the semiconductor body and the interconnection board and electrically connected to an internal circuit of the semiconductor body; an external connection terminal formed on a rear surface side of the interconnection board which lies opposite to a semiconductor body mounting surface thereof; an outer moat formed in a portion of the interconnection board which surrounds the external connection terminal and penetrating therethrough in a doughnut form; a first interconnection formed on a portion of the interconnection board which is surrounded by the outer moat and electrically connected to the external connection terminal; a second interconnection formed on a portion of the interconnection board which lies outside the outer moat and electrically connected to the internal connection terminal; and a conductor which electrically connects the first and second interconnections to each other, the conductor having at least one bent portion.

According to another aspect of the present invention, there is provided a semiconductor device mounting interconnection board comprising a board main body; an external connection terminal formed on one-surface side of the board main body; an outer moat formed in a portion of the board main body which surrounds the external connection terminal and penetrating therethrough in a doughnut form; a first interconnection formed on a portion of the board main body which is surrounded by the outer moat and electrically connected to the external connection terminal; a second interconnection formed on a portion of the board main body which lies outside the outer moat; and a conductor which electrically connects the first and second interconnections to each other, the conductor having at least one bent portion; wherein a semiconductor chip is mounted on another surface of the board main body which is different from the one-surface of the board main body.

DETAILED DESCRIPTION OF THE INVENTION

Figure 2A:
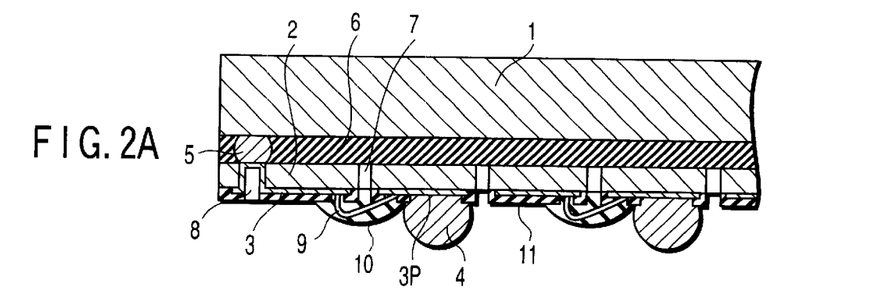
FIG. 2A is a cross sectional view for illustrating a semiconductor device and a semiconductor device mounting interconnection board according to a first embodiment of this invention.
Figure 2B:
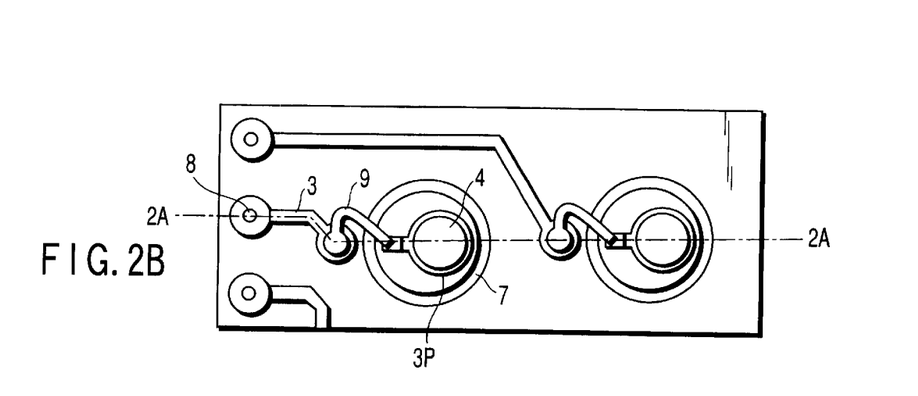
FIG. 2B is a schematic plan view showing the BGA pad surface of a package, for illustrating the semiconductor device and the semiconductor device mounting interconnection board according to the first embodiment of this invention.

FIGS. 2A and 2B illustrate a semiconductor device and a semiconductor device mounting interconnection board according to a first embodiment of this invention, FIG. 2A is a cross sectional view, FIG. 2B is a schematic plan view of a BGA pad surface of the package, and FIG. 2A corresponds to the cross section taken along the 2A—2A line of FIG. 2B.

That is, a semiconductor body 1 and an Si interconnection board 2 are connected in a flip chip manner via conductive bumps (internal connection terminals) 5. Penetration holes 8 are formed in portions of the Si interconnection board 2 which lie directly under the connecting portions between the interconnection board and the semiconductor body 1, and interconnections 3 are formed to extend from the internal portions of the respective penetration holes 8 to the opposite surface side thereof. Further, BGA pads (interconnections) 3P are formed on the Si interconnection board 2 and outer moats 7 which are formed to penetrate the Si interconnection board 2 are formed to respectively surround the BGA pads so that the BGA pads will be separated from the main body of the Si interconnection board 2. BGA balls 4 used as external connection terminals are formed on the respective BGA pads 3P. The BGA pad 3P and the interconnection 3 of the main body of the Si interconnection board 2 are connected via a bonding wire 9. High-elastic elastomer layers 6, 10 are formed in a gap between the semiconductor body 1 and the Si interconnection board 2, in the outer moats 7 surrounding the BGA pads 3P and on surrounding portions of the bonding wires 9.

In this embodiment, since no thermal stress occurs between the semiconductor body 1 and the Si interconnection board 2, connection between them is highly reliable and since the BGA balls 4 used as the external connection terminals for connection with a mounting board are separated from the main body by the outer moats 7 surrounding the respective BGA balls, thermal stress can be released and extremely high reliability can be attained. In addition, since the same material (silicon) as that used in the semiconductor body is used to form the Si interconnection board 2 in the semiconductor device of this embodiment, the package is not warped by a difference in thermal expansion between the semiconductor body and the organic interconnection board unlike the case disclosed in U.S. Pat. No. 5,148,266 and Jpn. Pat. Appln. KOKAI Publication No. 11-284099. Further, since electrical connection between the semiconductor body 1 and the Si interconnection board 2 is attained by use of the interconnection formed to extend from the internal portion of the penetration hole 8 to the rear surface side, it is only required to form interconnections of the Si interconnection board 2 only on the BGA ball 4 side. Since the BGA ball 4 is elastically formed in the vertical direction, an effect that a test probe can be brought into contact with the BGA ball with weak application force can be attained.

Figure 3A:
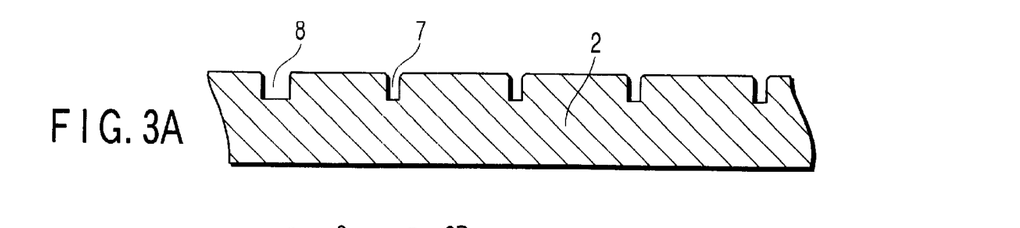
FIGS. 3A to 3G are cross sectional views sequentially showing manufacturing steps of an Si interconnection board used in the semiconductor device according to the first embodiment of this invention.

FIGS. 3A to 3G are cross sectional views sequentially showing the manufacturing steps of the Si interconnection board (semiconductor device mounting interconnection board) 2. First, penetration holes 8 and outer moats 7 are formed to a preset depth by subjecting an Si wafer (Si interconnection board) 2 to a highly anisotropic etching process such as RIE and then an insulating layer (not shown) is formed to cover the surface of the resultant structure by the thermal oxidation method or CVD method (FIG. 3A).

Figure 3B:
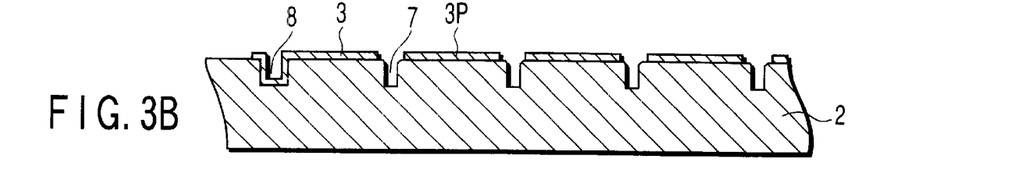
Figure 3C:
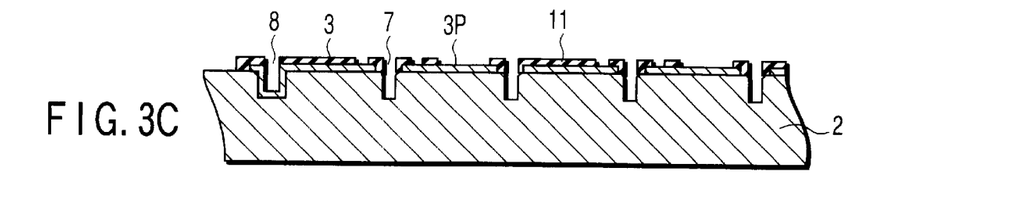

After this, metal is vapor-deposited on the insulating layer and a vapor-deposited film is patterned to form interconnections 3 and BGA pads 3P (FIG. 3B). It is of course possible to form the interconnection 3 and BGA pad 3P in a multi-layered form as required.

Figure 3D:
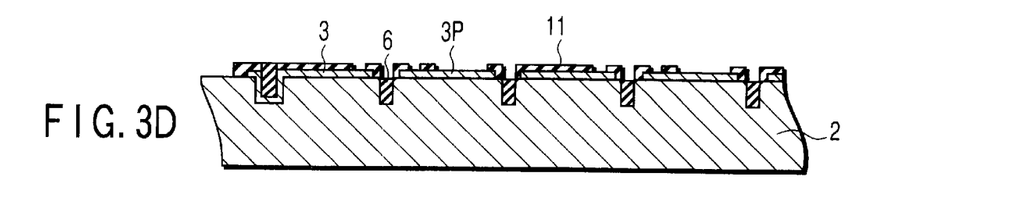

After formation of the interconnections 3 and BGA pads 3P, the surface of the wafer 2 is covered with a passivation film 11, then openings are selectively formed in the passivation film (FIG. 3C) and elastomer 6 is filled into the penetration holes 8 and outer moats 7 (FIG. 3D).

Next, the wafer 2 is discretely diving and grinding the rear surface thereof so that the wafer will form the external form of the Si interconnection board. In this example, a case wherein a method for forming a dicing groove 12 to a preset depth according to the external form of the Si interconnection board (FIG. 3E) and then grinding the rear surface thereof to discretely divide the Si interconnection board is used is explained. In this case, it is necessary that the depth of the dicing groove 12 is deeper than at least the bottom of the penetration hole 8 and shallower than the thickness of the wafer 2. Further, the rear surface grinding process is effected until the interconnection 3 on the bottom of the penetration hole 8 is exposed.

Figure 3E:
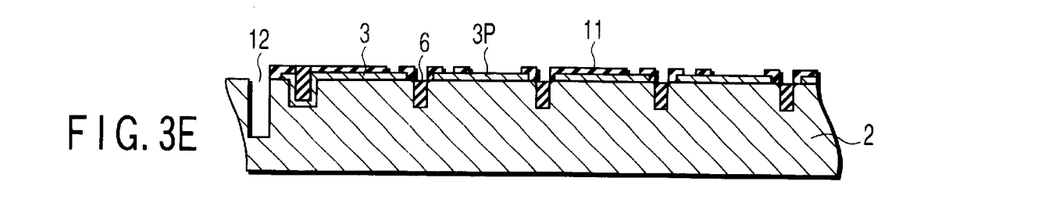
Figure 3F:
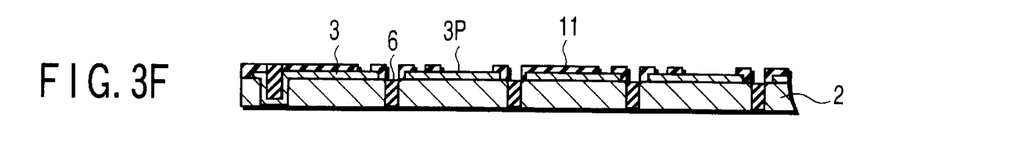

The rear surface grinding process can be effected by use of a chemical etching method other than a normal BSG (back side grinding) method using a grindstone, or a combination thereof. Further, the dicing groove can be formed together with the penetration hole 8 and outer moats 7 at the wafer processing stage or by use of the same method, but in this case, it is necessary to effect a masking process or etch-out process so as not to fill the elastomer 6 into the dicing groove 12.

Figure 3G:
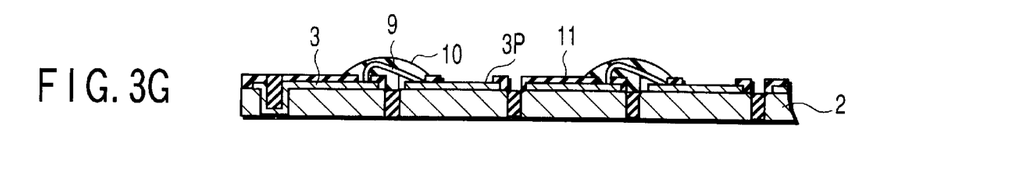

Finally, after a wire bonding process is effected to connect the BGA pads 3P to the main body interconnections 3, elastomer 10 is coated to protect bonding wires 9 (FIG. 3G). Thus, the Si interconnection board 2 shown in FIGS. 2A and 2B is completed.

In the above example, the wire bonding process is effected after the Si interconnection board 2 is discretely divided, but it can be effected in the last step of the wafer processing stage.

Figure 4:
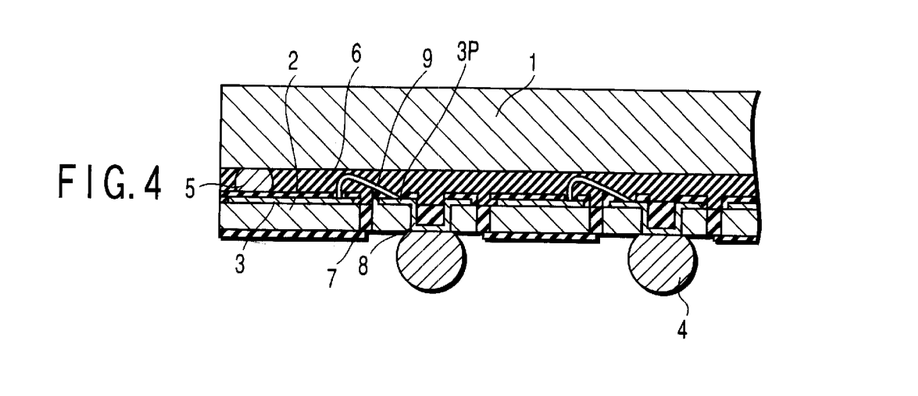
FIG. 4 is a cross sectional view for illustrating a semiconductor device and a semiconductor device mounting interconnection board according to a second embodiment of this invention.

FIG. 4 is a cross sectional view for illustrating a semiconductor device and a semiconductor device mounting interconnection board according to a second embodiment of this invention. In the second embodiment, interconnections 3 and BGA pads 3P of an Si interconnection board 2 are formed on one-surface side of the interconnection board which is adhered to a semiconductor body 1. Therefore, penetration holes 8 are formed directly above the respective BGA balls 4 used as external connection terminals. Further, since bonding wires 9 are arranged in a gap between the semiconductor body 1 and the Si interconnection board 2, elastomer 6 which is filled into the gap can also be used to protect the bonding wires. of course, as in the first embodiment, the elastomer 10 can be previously formed around the bonding wire 9 without causing any problem. Since the ground surface of the Si interconnection board 2 is exposed, it is preferable to protect the BGA balls 4 surfaces by use of an insulating film. In this case, however, if resin is filled between the interconnection board and a mounting board, resin can be used as the insulating protection film.

Like the first embodiment, in the present embodiment, since no thermal stress occurs between the semiconductor body 1 and the Si interconnection board 2, connection between them is highly reliable and since the BGA balls 4 used as the external connection terminals for connection with the mounting board are separated from the main body by the outer moats 7 surrounding the respective BGA balls, thermal stress can be released and extremely high reliability can be attained. In addition, the package is not warped owing to a difference of thermal expansion between the semiconductor body and the organic interconnection board. Further, since electrical connection between the BGA ball 4 and the Si interconnection board 2 is attained by the BGA pad 3P formed to extend from the internal portion of the penetration hole 8 to the rear surface side, it is only required to form interconnections of the Si interconnection board 2 only on the surface side thereof which is adhered to the semiconductor body 1. Since the BGA ball 4 is elastically formed in the vertical direction, a test probe can be brought into contact with the BGA ball with weak application force.

Of course, the Si interconnection board 2 of the second embodiment can be obtained by use of the process corresponding to the manufacturing method of the Si interconnection board 2 of the first embodiment shown in FIGS. 3A to 3G, but it is also possible to form a package in the wafer state.

Figure 5A:
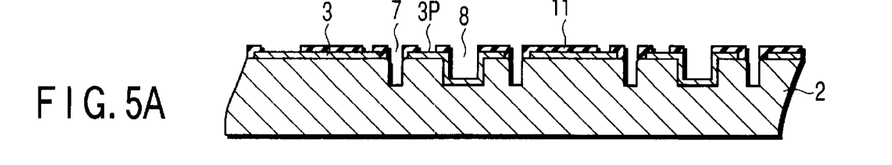
FIGS. 5A to 5E are conceptual views showing one example of steps of manufacturing an Si interconnection board in the wafer state used in the semiconductor device according to the second embodiment of this invention.
Figure 5B:
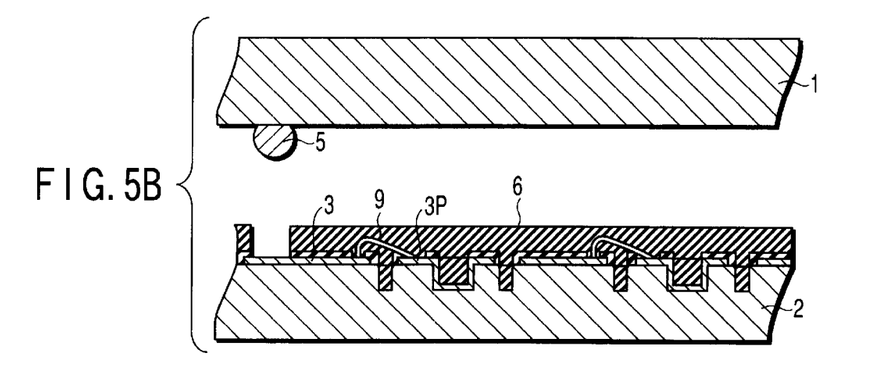
Figure 5C:
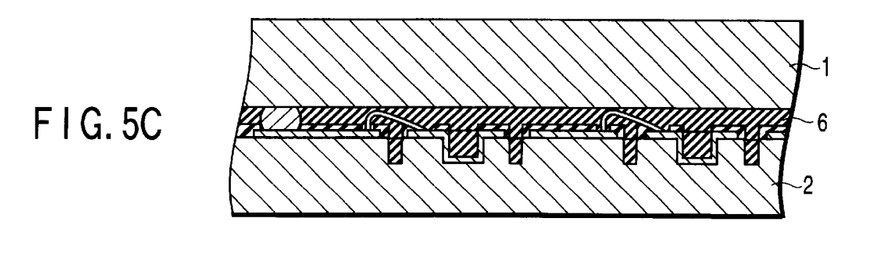

FIGS. 5A to 5E are conceptual views showing one example of steps of manufacturing a semiconductor device mounting interconnection board in the wafer state according to the second embodiment. As shown in FIG. 5A, a wire bonding process is effected for the Si interconnection board 2 which is kept in the wafer state and in which the outer moats 7, penetration holes 8, interconnections 3, BGA pads 3P and passivation film 11 are formed by a method corresponding to the manufacturing method shown in FIGS. 3A to 3C so as to connect the interconnections 3 and the BGA pads 3P to each other. After this, elastomer 6 is coated on the structure in the wafer state and then a semiconductor body 1 is mounted on the structure in a flip chip interconnection method (FIG. 5B). At this time, the semiconductor body 1 may be set in a wafer state or a discrete semiconductor chip. The elastomer 6 lying between the Si interconnection board 2 and the semiconductor body 1 may be provided before the Si interconnection board 2 and the semiconductor body 1 are connected to each other as in the present embodiment or filled after the Si interconnection board 2 and the semiconductor body 1 are connected to each other.

In the present embodiment, supply of the elastomer 6 into the outer moats 7 of the BGA pads 3P and the penetration holes 8 is replaced by filling resin in the gap between the semiconductor element 1 and the Si interconnection board 2, but elastomer may be previously supplied or no material may be filled therein to the last.

Figure 5D:
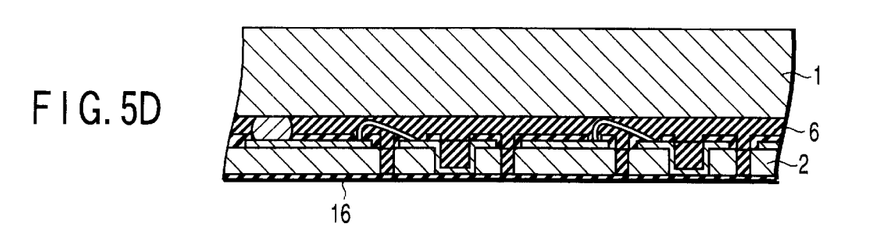
Figure 5E:
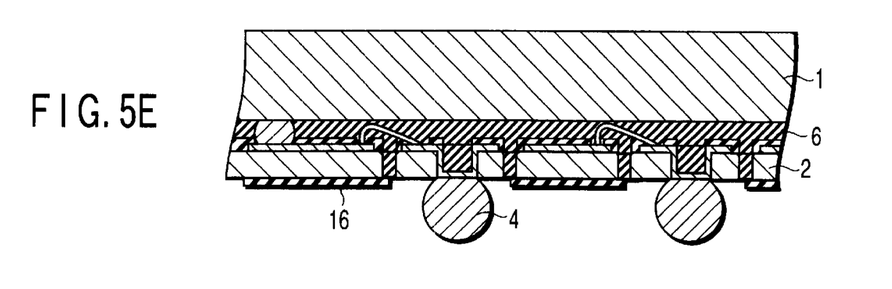

After the semiconductor body 1 and the Si interconnection board 2 are bonded to each other (FIG. 5C), the rear surface of the Si interconnection board 2 is ground or etched until portions of the interconnections 3 which lie on the bottoms of the penetration holes 8 are exposed and then an insulating protection film 16 is formed (FIG. 5D). Next, patterning the insulating protection film 16. BGA balls 4 which are external connection terminals are formed directly under the penetration holes 8 of the exposed portions of the insulating protection film 16 (FIG. 5E), and if the interconnection board is discretely divided by dicing, a semiconductor device mounting interconnection board of the second embodiment is completed. Of course, whether the process for forming the BGA balls 4 or the discretely dividing process is previously effected is not important.

Figure 6:
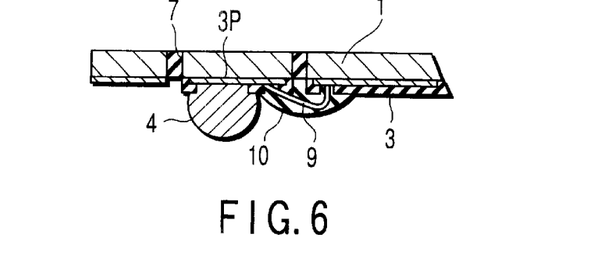
FIG. 6 is a cross sectional view for illustrating a semiconductor device according to a third embodiment of this invention.
Figure 7:
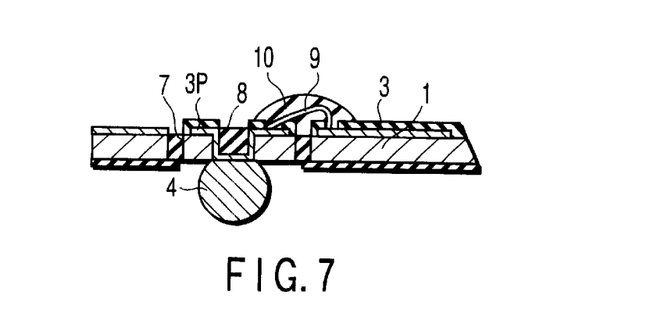
FIG. 7 is a cross sectional view for illustrating a semiconductor device according to a fourth embodiment of this invention.

FIGS. 6 and 7 are cross sectional views for illustrating semiconductor devices according to third and fourth embodiments of this invention. In the above first and second embodiments, the structure in which the semiconductor body 1 is adhered to the Si interconnection board 2 by use of the high-elastic resin (elastomer) 6 is explained as an example, but in the third and fourth embodiments, the above structure is applied to a bare chip.

That is, the structure is attained by forming an outer moat 7 which penetrates through a semiconductor chip 1 in a doughnut form in the semiconductor chip 1, forming a BGA ball (external connection terminal) 4 inside a region defined by the outer moat 7 and connecting a semiconductor element main body interconnection to the external connection terminal by use of wire bonding. FIG. 6 shows an example in which the BGA ball 4, BGA pad 3P, bonding wire 9 and interconnection 3 are formed on the circuit forming surface side of the semiconductor chip 1. Further, FIG. 7 shows an example in which the BGA ball 4 is formed on the rear surface side of the semiconductor chip 1 opposite to the circuit forming surface thereof and the BGA pad 3P, bonding wire 9 and interconnection 3 are formed on the circuit forming surface side of the semiconductor chip 1 and the BGA ball 4 and BGA pad 3P are connected to each other via a penetration hole 8.

By using the semiconductor chip 1 of the above embodiments, highly reliable connection to the mounting board can be attained without making a package form (that is, with a bare chip).

Figure 8A:
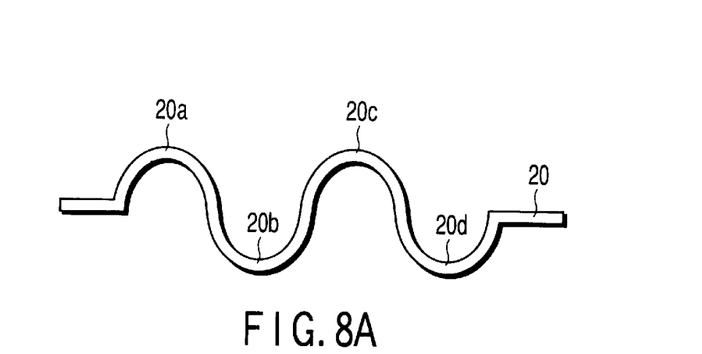
FIGS. 8A and 8B are plan views for illustrating another example of the connection structure between the BGA pad and the interconnection.

In each of the above embodiments, the structure in which the BGA ball 4 and BGA pad 3P are connected to each other via the bonding wire 9 is explained. However, they may be connected together by use of a metal interconnection layer 20 formed in a zigzag form and having bent portions 20a to 20d as shown in FIG. 8A, for example. The number of bent portions and the plane configuration thereof are arbitrarily set and determined as required.

Figure 8B:
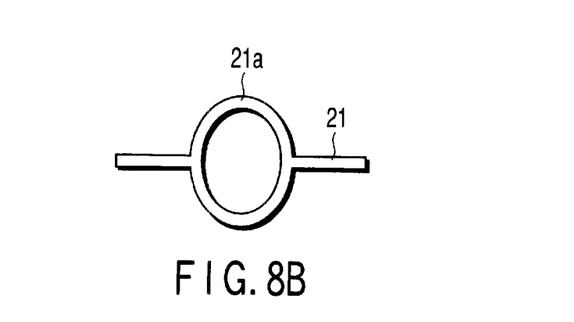

Alternatively, they may be connected together by use of a metal interconnection layer 21 having an annular region 21a as shown in FIG. 8B.

In the above structures, stress between the BGA pad 3P and the interconnection 3 can be alleviated by deforming the bent portion (part of the annular region 21a in the case of the structure of FIG. 8B). In short, a conductor of any structure which can connect the outer moat 7 and the main body to each other in a flexible manner can be used.

It is necessary to set the Young's modulus of the elastomer (high-elastic resin) layers 6, 10 used in each of the above embodiments in a range of 100 KPa to 500 MPa. If the Young's modulus is less than 100 Kpa, the BGA pad (interconnection) 3P cannot be fixed. Further, if the Young's modulus is more then 500 Mpa, the effect for alleviating the stress is degraded, and therefore, it is preferable to set the Young's modulus equal to or less than 100 Mpa.

Further, ideally, it is preferable that a large number of fine voids exist in the elastomer 6, 10. This is because a resin material generally exhibits rigidity with respect to deformation accompanied by a volume change even when the elastic modulus thereof is lowered. Further, by dispersing a large number of fine voids in resin, it becomes possible to cause air in the voids to easily follow the volume change.

A case wherein elastomer is filled in the internal portion of the outer moat is explained, but in the structure of the second embodiment, after the semiconductor body 1 and the Si interconnection board 2 are bonded to each other, the rear surface of the Si interconnection board 2 is ground or etched. Therefore, at least part of the internal portions can be made hollow.

Further, a case wherein the semiconductor body 1 and Si interconnection board 2 are both formed of silicon is explained, but this invention can be applied to a case wherein they are formed of another semiconductor material such as gallium arsenide (GaAs) and they can be formed of different materials if the thermal expansion coefficients of the semiconductor body and Si interconnection board are approximately equal to each other.

As described above, in the semiconductor devices according to the first and second embodiments of this invention, the external connection terminal is released from stress caused by the semiconductor body or interconnection board main body and can follow contraction or expansion of the mounting board, and therefore, extremely highly reliable connection with the exterior can be attained. Further, the external connection terminal is made flexible in the vertical direction, a test probe can be brought into contact with the external connection terminal with weak application force.

In addition, in the interconnection board of the semiconductor device (semiconductor device mounting interconnection board) according to the first and second embodiments of this invention, since the external connection terminal is released from stress caused by the semiconductor body or interconnection board main body and flexibly fixed by use of high-elastic resin, dropping of the external connection terminal from the mounting board can be prevented while highly reliable connection with the exterior is attained.

Further, in the semiconductor devices according to the third and fourth embodiments of this invention, the external connection terminal is released from stress caused by the semiconductor chip, and therefore, extremely highly reliable connection with the exterior can be attained.

Therefore, according to an aspect of this invention, a semiconductor device and semiconductor device mounting interconnection board can be attained in which stress caused by a thermal expansion difference between the semiconductor chip and the mounting board can be alleviated and which can be connected with high density.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor chip;

an external connection terminal formed on a circuit forming surface side of said semiconductor chip;

an outer moat formed in a portion of said semiconductor chip which surrounds said external connection terminal and penetrating therethrough in a doughnut form;

a first interconnection formed on a portion of said semiconductor chip which lie on the circuit forming surface side and is surrounded by said outer moat and electrically connected to said external connection terminal;

a second interconnection formed on the circuit forming surface side of said semiconductor chip outside said outer moat and electrically connected to an internal circuit; and a conductor which electrically connects said first and second interconnections to each other, said conductor having at least one bent portion.

2. The semiconductor device according to claim 1, wherein an internal portion of said outer moat is filled with an elastomer.

3. The semiconductor device according to claim 2, wherein the Young's modulus of the elastomer is not larger than 500 MPa.

4. The semiconductor device according to claim 2, wherein the elastomer contains a plurality of fine voids in a dispersed manner.

5. A semiconductor device comprising:

a semiconductor chip;

an external connection terminal formed on a rear surface side of said semiconductor chip which is opposite to a circuit forming surface side thereof;

an outer moat formed in a portion of said semiconductor chip which surrounds said external connection terminal and penetrating therethrough in a doughnut form;

a first interconnection formed on a portion of said semiconductor chip which lie on the circuit forming surface side and is surrounded by said outer moat and electrically connected to said external connection terminal via a penetration hole formed in said semiconductor chip;

a second interconnection formed on the circuit forming surface side of said semiconductor chip outside said outer moat and electrically connected to an internal circuit; and a conductor which electrically connects said first and second interconnections to each other, said conductor having at least one bent portion.

6. The semiconductor device according to claim 5, wherein an internal portion of said outer moat is filled with an elastomer.

7. The semiconductor device according to claim 6, wherein the Young's modulus of the elastomer is not larger than 500 MPa.

8. The semiconductor device according to claim 6, wherein the elastomer contains a plurality of fine voids in a dispersed manner.

9. A semiconductor device comprising:

an interconnection board;

a semiconductor body adhered to said interconnection board by use of an. elastomer;

an internal connection terminal formed in an adhering potion between said semiconductor body and said interconnection board and electrically connected to an internal circuit of said semiconductor body;

an external connection terminal formed on a rear surface side of said interconnection board which lies opposite to a semiconductor body mounting surface thereof;

an outer moat formed in a portion of said interconnection board which surrounds said external connection terminal and penetrating therethrough in a doughnut form;

a first interconnection formed on a portion of said interconnection board which is surrounded by said outer moat and electrically connected to said external connection terminal;

a second interconnection formed on a portion of said interconnection board which lies outside said outer moat and electrically connected to said internal connection terminal; and a conductor which electrically connects said first and second interconnections to each other, said conductor having at least one bent portion.

10. The semiconductor device according to claim 9, wherein said first interconnection, said second interconnection and said conductor are provided on the rear surface side of said interconnection board which lies opposite to the semiconductor body mounting surface thereof, and said second interconnection is electrically connected to said internal connection terminal via a penetration hole formed in said interconnection board.

11. The semiconductor device according to claim 9, wherein said first interconnection, said second interconnection and said conductor are provided on the semiconductor body mounting surface of said interconnection board, and said first interconnection is electrically connected to said external connection terminal via a penetration hole formed in said interconnection board.

12. The semiconductor device according to claim 11, wherein at least part of an internal portion of said outer moat is hollow.

13. The semiconductor device according to claim 9, wherein an internal portion of said outer moat is filled with an elastomer.

14. The semiconductor device according to claim 13, wherein the Young's modulus of the elastomer is not larger than 500 MPa.

15. The semiconductor device according to claim 13, wherein the elastomer contains a plurality of fine voids in a dispersed manner.

16. A semiconductor device mounting interconnection board comprising:

a board main body;

an external connection terminal formed on one-surface side of said board main body;

an outer moat formed in a portion of said board main body which surrounds said external connection terminal and penetrating therethrough in a doughnut form;

a first interconnection formed on a portion of said board main body which is surrounded by said outer moat and electrically connected to said external connection terminal;

a second interconnection formed on a portion of said board main body which lies outside said outer moat; and a conductor which electrically connects said first and second interconnections to each other, said conductor having at least one bent portion;

wherein a semiconductor chip is mounted on another surface of said board main body which is different from the one-surface of said board main body.

17. The semiconductor device mounting interconnection board according to claim 16, wherein said first interconnection, said second interconnection and said conductor are provided on one-surface side of said board main body, and said second interconnection is lead out to another surface via a penetration hole formed in said board main body.

18. The semiconductor device mounting interconnection board according to claim 16, wherein said first interconnection, said second interconnection and said conductor are provided on another surface side of said board main body, and said first interconnection is electrically connected to said external connection terminal via a penetration hole formed in said board main body.

19. The semiconductor device mounting interconnection board according to claim 18, wherein at least part of an internal portion of said outer moat is hollow.

20. The semiconductor device mounting interconnection board according to claim 16, wherein an internal portion of said outer moat is filled with elastomer.

21. The semiconductor device mounting interconnection board according to claim 20, wherein the Young's modulus of the elastomer is not larger than 500 MPa.

22. The semiconductor device mounting interconnection board according to claim 20, wherein the elastomer contains a plurality of fine voids in a dispersed manner.

* * * * *

UNITED STATES PATENT AND TRADEMARK OFFICE
CERTIFICATE OF CORRECTION

PATENT NO. : 6,437,434 B1
DATED : August 20, 2002
INVENTOR(S) : Sugizaki

It is certified that error appears in the above-identified patent and that said Letters Patent is hereby corrected as shown below:

Column 8,
Line 43, "which lie" should read -- which lies --.

Column 9,
Line 5, "which lie" should read -- which lies --.
Line 29, "an. elastomer;" should read -- an elastomer; --.

Column 10,
Line 41, "is lead out" should read -- is led out --.

Signed and Sealed this

Eighteenth Day of March, 2003

JAMES E. ROGAN
*Director of the United States Patent and Trademark Office*